United States Patent [19]

Brown et al.

[11] Patent Number: 6,136,656
[45] Date of Patent: Oct. 24, 2000

[54] METHOD TO CREATE A DEPLETED POLY MOSFET

[75] Inventors: Jeffrey S. Brown, Middlesex; Robert J. Gauthier, Hinesburg; William R. Tonti, Essex Junction; Steven H. Voldman, South Burlington, all of Vt.

[73] Assignee: International Business Machines Corporation, Armonk, N.Y.

[21] Appl. No.: 09/176,815

[22] Filed: Oct. 22, 1998

[51] Int. Cl.⁷ .................................................. H01L 21/336
[52] U.S. Cl. .................... 438/294; 438/229; 438/549; 438/551; 438/552; 257/392
[58] Field of Search .................... 438/275, 549, 438/551, 552, 229; 257/392

[56] References Cited

U.S. PATENT DOCUMENTS

| | | | |
|---|---|---|---|
| 4,085,498 | 4/1978 | Rideout | 29/571 |
| 4,177,390 | 12/1979 | Cappon | 307/205 |
| 4,315,781 | 2/1982 | Henderson | 148/1.5 |
| 4,365,405 | 12/1982 | Dickman et al. | 29/571 |
| 4,398,962 | 8/1983 | Kanazawa | 148/1.5 |
| 4,485,390 | 11/1984 | Jones et al. | 357/23 |
| 4,799,092 | 1/1989 | Klaassen | 357/23.12 |
| 5,047,358 | 9/1991 | Kosiak et al. | 437/34 |
| 5,300,443 | 4/1994 | Shimabukuro et al. | 437/34 |
| 5,432,114 | 7/1995 | O | 437/34 |
| 5,447,875 | 9/1995 | Moslehi | 437/41 |
| 5,480,830 | 1/1996 | Liao et al. | 437/58 |
| 5,550,397 | 8/1996 | Lifshitz et al. | 257/412 |
| 5,625,217 | 4/1997 | Chau et al. | 257/412 |
| 5,637,903 | 6/1997 | Liao et al. | 257/412 |

OTHER PUBLICATIONS

S. Wolf, Silicon Processing for the VLSI Era, vol. 1: Process Technology, Lattice Press: Sunset Beach, CA, pp. 321–325, 1986.

H. Ryssel and I. Ruge, Ion Implantation, John Wiley and Sons: Chichester, pp. 71–72, 1986.

S. Wolf, Silicon Processing for the VLSI Era, vol. 2: Progress Integration, Lattice Press: Sunset Beach, CA, pp. 354–356, 1990.

*Primary Examiner*—Charles Bowers
*Assistant Examiner*—Erik J Kielin
*Attorney, Agent, or Firm*—McGinn & Gibb, P.C.; Eugene I. Shkurko, Esq.

[57] ABSTRACT

A structure and method for forming a semiconductor structure includes forming a plurality of device layers on a substrate (the device layers including a blocking layer having a thickness correlating to a magnitude of implant attenuation), removing the blocking layer from selected devices of the semiconductor, and implanting an impurity into the substrate, the device layers and partially through the blocking layer.

26 Claims, 5 Drawing Sheets

METHOD TO CREATE A DEPLETED POLY MOSFET

BACKGROUND OF THE INVENTION

1. Field of the Invention

The present invention generally relates to processes for fabricating metal oxide semiconductor field effect transistor (MOSFET) structures and more particularly to MOSFET structures which include lightly doped polysilicon gates, operating at high operating voltages, and MOSFET structures which include more heavily doped polysilicon gate structures which operate at low operating voltages.

2. Description of the Related Art

As the gate oxide thickness decreases in today's advanced complementary metal oxide semiconductor (CMOS) technologies, the maximum voltage (Vmax) allowed across the gate oxide also decreases. The decrease in Vmax makes interfacing with technologies which have higher supply voltages more difficult.

Conventional solutions to interface with technologies which have higher supply voltages include using circuit techniques to step down the voltage which is seen across the oxide and creating a dual oxide process which supports a higher Vmax. Using circuit techniques to step down the voltage increases circuit complexity and decreases overall chip speed. Using a dual oxide process increases the processing cost and complexity.

Conventional methods form multiple CMOS devices on a single wafer. Each of the CMOS devices includes a polysilicon gate and a thin gate oxide between the polysilicon gate and the substrate. Ions are implanted to dope the polysilicon gate and the adjacent source and drain structures.

Selected polysilicon gates are protected with a sacrificial layer and the remaining polysilicon gates are subjected to a lightly doped ion implantation. Conventional processes then dope other polysilicon gates using a heavier source-drain implant. In the second ion implantation step, the lightly doped polysilicon gates are protected with another sacrificial layer and the exposed polysilicon gates are subject to the second ion implantation.

This repetitive masking-implantation process produces some polysilicon gates with lighter doping and other polysilicon gates with heaver doping. The blocking of the second ion implantation produces lightly doped gates in the blocked devices, which are sometimes referred to as poly depleted gates. The lightly doped or undoped polysilicon gates accommodate higher voltages.

While such conventional methods simultaneously produce CMOS chips which can handle high voltages and CMOS chips which can handle low voltages, these methods require additional processing steps to deposit and remove sacrificial layers and require additional implantation steps which are avoided by the invention.

SUMMARY OF THE INVENTION

It is, therefore, an object of the present invention to provide a method for forming a self-aligned semiconductor structure. More specifically, the invention includes forming a plurality of device layers on a substrate (the device layers including a blocking layer having a preselected thickness correlating to a magnitude of implant attenuation), removing the blocking layer from selected devices of the semiconductor, and implanting an impurity into the substrate, the device layers and through the blocking layer.

The invention also includes patterning the blocking layer to form blocks over gate regions of the gate layer, which removes portions of the gate layer not covered by the blocks and forms gates below the blocks. The removing process selectively exposes first gate regions and protects second gate regions. A first dosage of the impurity is implanted in the first gate regions and a second dosage lower than the first dosage is implanted in the second gate regions using one implant. Therefore, the first gate regions operate at a lower voltage than the second gate regions. The implanting process also implants the first dosage into the source and drain regions.

A key advantage of the invention are that the blocks and the gates are formed in a single removal process, the implanting comprises a single process and the blocks are self-aligned with the gates.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 1A:
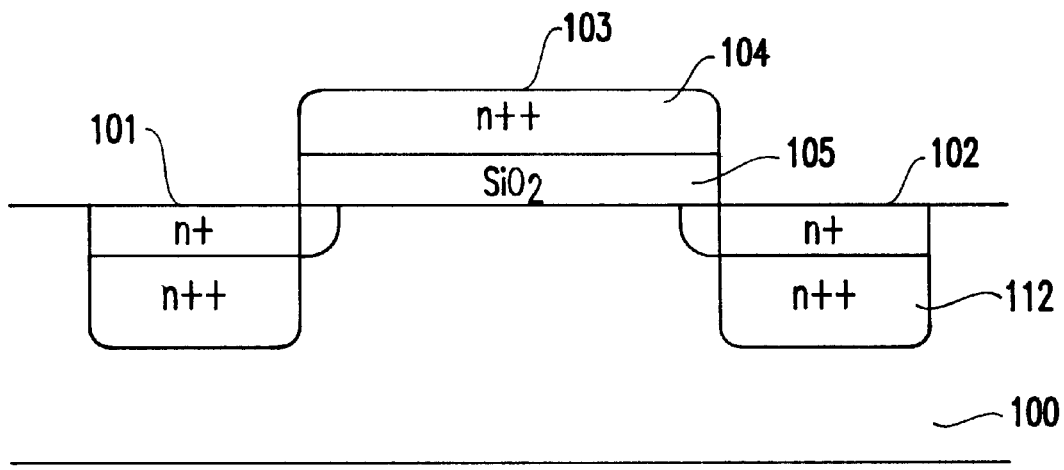
FIG. 1A is a schematic diagram of an N-type semiconductor transistor according to the invention.
Figure 1B:
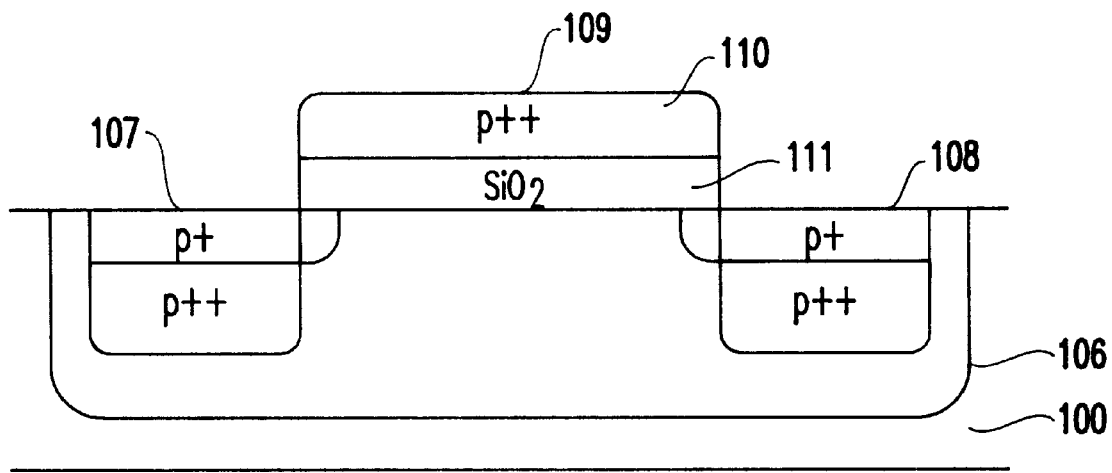
FIG. 1B is a schematic diagram of a P-type semiconductor transistor according to the invention.

Referring now to the drawings, and more particularly to FIGS. 1A and 1B, N-type field effect transistors (NFET) and P-type field effect transistors (PFET) in advanced complementary metal-oxide semiconductor (CMOS) technologies are illustrated.

More specifically, FIG. 1A illustrates a structure having a substrate 100 (in this case P-type), a drain 101, a source 102 and a gate 103. The source 102 and gate include a heavily doped region 112. The gate 103 includes a heavily doped polysilicon layer 104. The heavily doped polysilicon layer 104 is separated from the substrate 100 by an insulating silicon dioxide layer 105.

Similarly, FIG. 1B illustrates a structure having a drain 107, source 108 and a gate 109 having a polysilicon gate layer 110 insulated from an N-well 106 by a silicon dioxide insulating layer 111. The structure illustrated in FIG. 1A is an N-type CMOS structure while the structure illustrated in FIG. 1B is a P-type CMOS structure.

Figure 2A:
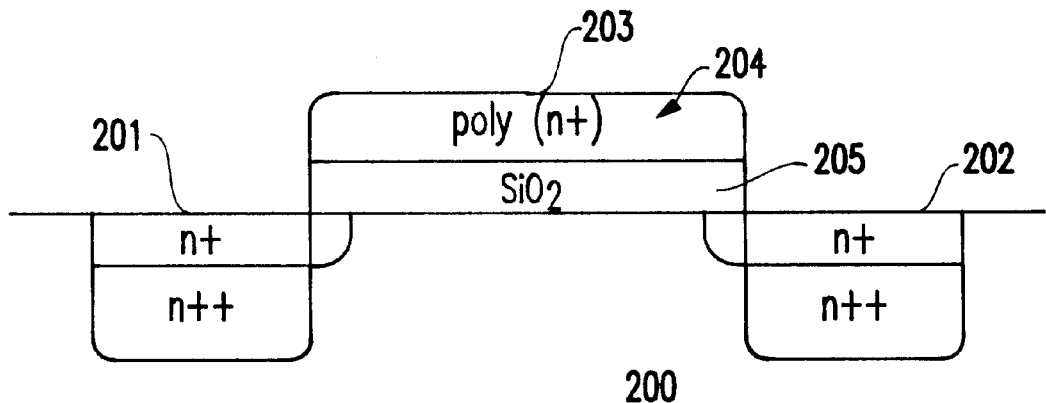
FIG. 2A is a schematic diagram of an N-type semiconductor transistor according to the invention.
Figure 2B:
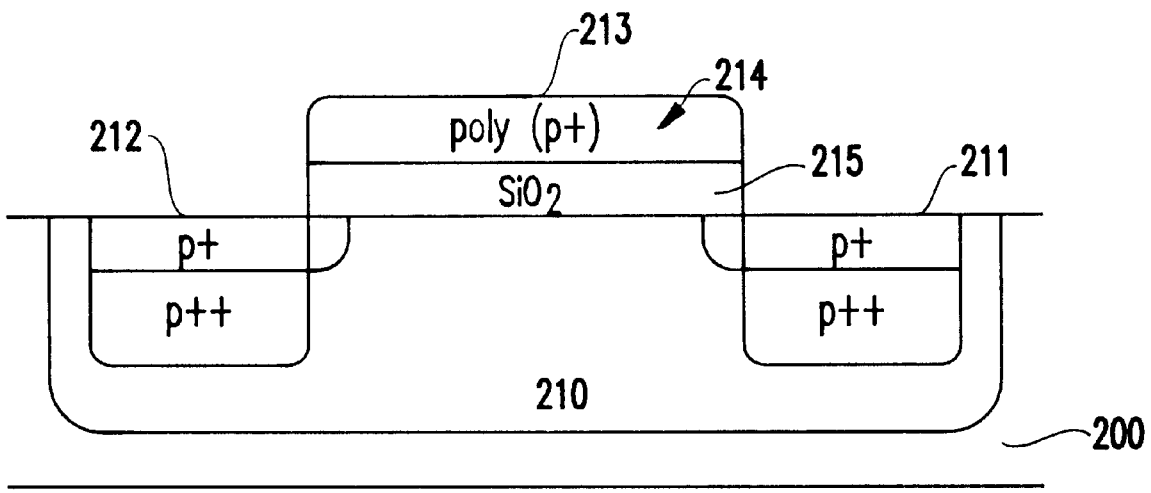
FIG. 2B is a schematic diagram of a P-type semiconductor transistor according to the invention.

FIGS. 2A and 2B, respectively illustrate poly depleted NFET and PFET structures which, as discussed in the Background section, are highly useful for higher voltage input/output interface applications.

The structure in FIG. 2A includes a substrate 200 (in this case P-type), a drain 201, a source 202 and a gate 203. As before, the gate includes a polysilicon layer 204 and an insulating silicon dioxide layer 205. Further, the polysilicon layer 204 comprises a lightly doped implant extension (e.g., n$^+$). Similarly, the structure in FIG. 2B includes a well 210, a drain 211, a source 212 and a gate 213. As before, the gate includes a polysilicon layer 214 and an insulating silicon dioxide layer 215. Further, the polysilicon layer 214 comprises an lightly doped implant extension (e.g., p$^+$). Thus, the above structures include lightly doped regions n$^+$, p$^+$ and heavily doped regions n$^{++}$, p$^{++}$.

While conventional methods can be utilized to form a poly-depleted metal oxide semiconductor field effect transistor (MOSFET), the inventive method, described below, is superior to conventional methods and structures in that the MOSFET device is created without requiring any additional masks (such as the second sacrificial layer discussed in the Background section, above) or implantation steps.

Figure 3A:
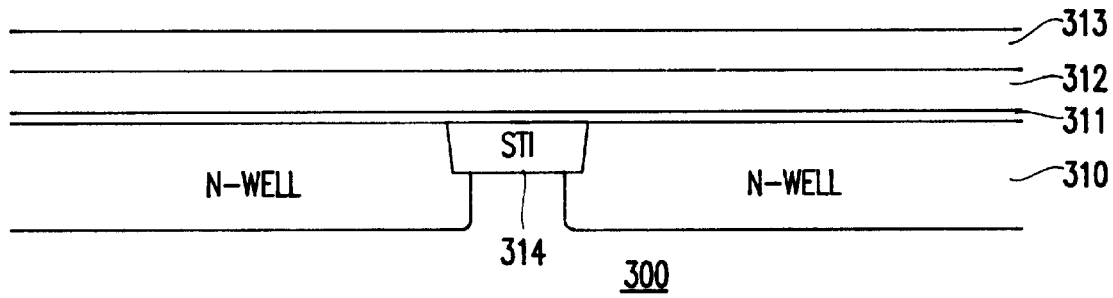
FIGS. 3A–3C are schematic drawings of a semiconductor device that progressively illustrates a process of the invention.
Figure 3B:
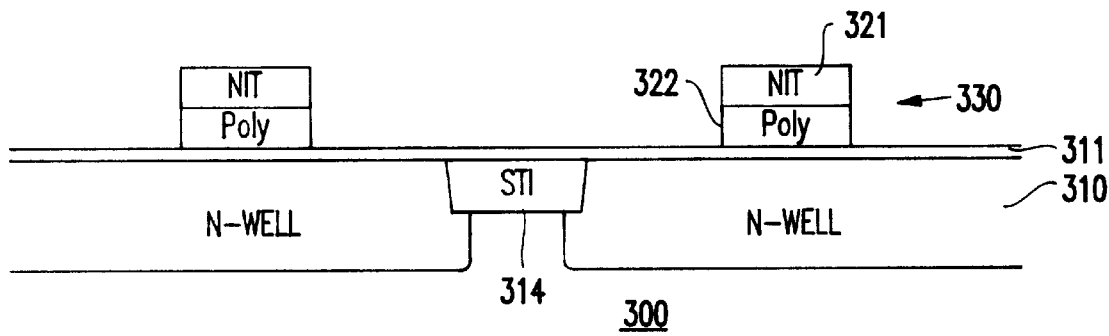
Figure 3C:
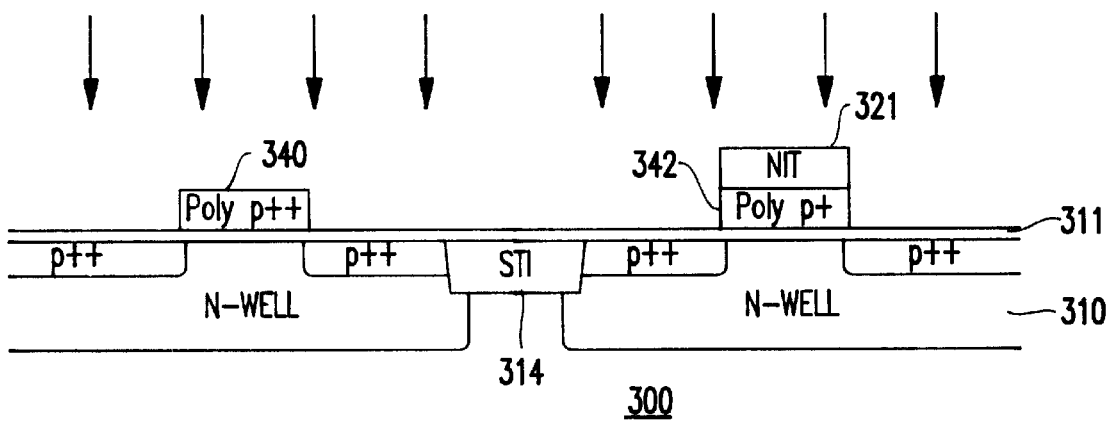

Referring now to FIGS. 3A–3C, a first preferred embodiment of the invention is illustrated. More specifically, FIG. 3A illustrates a P-type semiconductor structure that includes a silicon substrate 300 having N-wells 310, an oxide layer 311, a polysilicon layer 312 and a nitride layer (e.g., blocking layer) 313 over the polysilicon layer 312. In FIG. 3B, the nitride 313 and polysilicon layers 312 are etched using a mask and common etching techniques to form a nitride-poly stack 330.

Therefore, the nitride blocker layer 321 of the nitride-poly stack 330 is self-aligned with the polysilicon gate 322. Further, the invention does not add additional masking steps to form the nitride blockers 321, because the conventional process requires such a mask to form the polysilicon gate structures 322.

In FIG. 3C, the nitride blocker 321 is stripped from selected ones of the nitride and polysilicon stacks 330 using a mask and conventional removal techniques. This produces the structure illustrated in FIG. 3C which includes extensions having only the polysilicon layer 340 and extensions having both nitride 321 and polysilicon layers 342.

After the nitride layers are selectively stripped from the nitride and polysilicon stacks 330, an impurity is implanted into the polysilicon as indicated by the downward pointing arrows in FIG. 3C. The polysilicon gate extensions 340 which are not covered by a nitride layer 321 receive a heavier doping of impurities than do the polysilicon gates 342 which are covered by the nitride layer 321. Therefore, the polysilicon gate structures 340 which do not include the nitride layer become heavily doped gate extensions useful for high-performance, lower voltage applications and the gate extension stacks 342 which include the nitride layer 321 become lightly doped structures useful for higher voltage, lower performance applications.

In other words, the nitride layer allows only a portion of the impurities to reach the underlying polysilicon layer 342 in the nitride-poly stacks 330. Further, the magnitude of the impurity implant is controlled by the thickness of the nitride layer 321. A thinner nitride layer 321 will allow more impurities to be implanted into the polysilicon gate extension 342 while a thicker nitride layer 321 will allow less impurity to be implanted into the underlying polysilicon gate extension 342. For example, the nitride blocking layer preferably has a thickness in the range of 400 Å to 1000 Å, but could be any reasonable thickness to achieve the desired goals for the specific device in question.

After the impurity implantation, the remaining nitride layer is stripped, which leaves heavily doped polysilicon gates 340 and lightly doped polysilicon gates 342 on the same wafer.

Figure 4A:
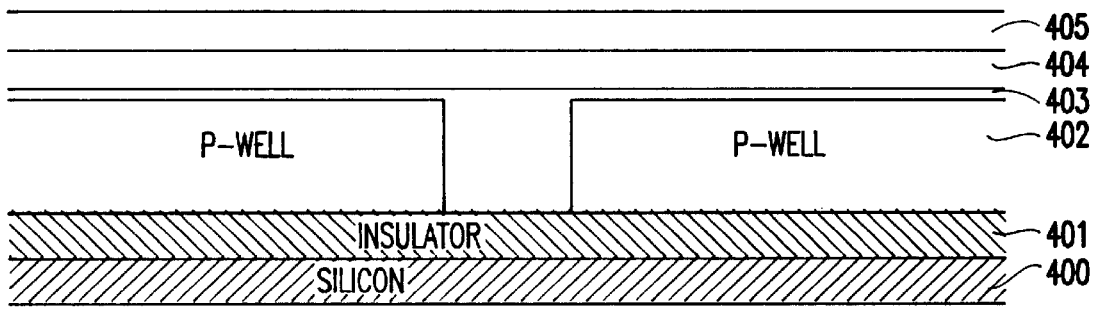
FIGS. 4A–4C are schematic drawings of a semiconductor device that progressively illustrates a process of the invention.
Figure 4B:
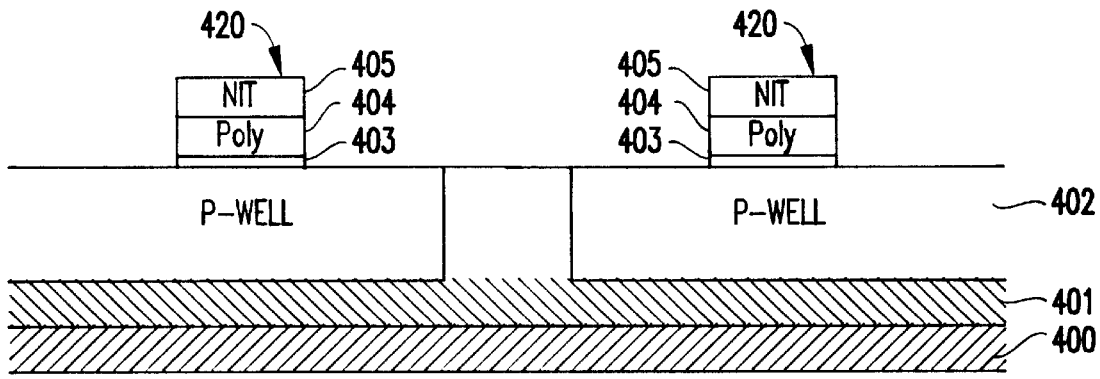
Figure 4C:
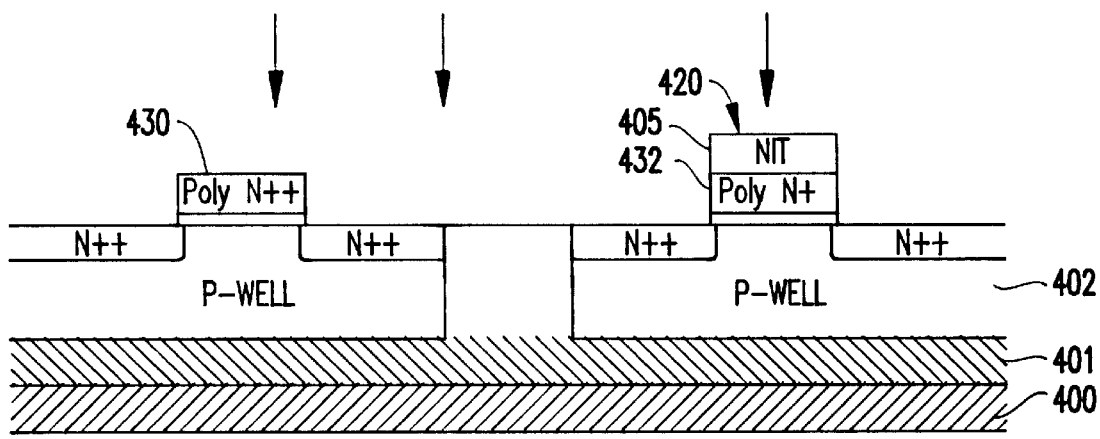

FIGS. 4A–4C are similar to FIGS. 3A–3C except that FIGS. 3A–3C illustrate the formation of a P-type MOSFET while FIGS. 4A–4C illustrate the formation of an N-type MOSFET. More specifically, as shown in FIG. 4A, a structure is formed that includes a silicon substrate 400 (in this case P-type), an insulating layer 401, P-wells 402, an oxide layer 403, a polysilicon layer 404 and a nitride layer 405. Similarly, in FIG. 4B, an etching process is used to form the polysilicon-nitride extensions 420.

In a similar manner as with the P-type MOSFET shown in FIGS. 3A–3C, the nitride blocker 405 is stripped from selected ones of the gate extensions 420 which produces gate extensions having only a polysilicon layer 430 and gate extensions which also include a nitride layer 405 above the polysilicon layer 432. Again, an impurity is implanted as indicated by the arrows in FIG. 4C and the remaining nitride layer 405 is stripped.

As discussed above with respect to the P-type MOSFET in FIG. 3C, the structure in FIG. 4C simultaneously produces heavily doped gate extensions 430 and lightly doped polysilicon gate extensions 432, on the same wafer.

While the invention has been discussed above with respect to a nitride layer above the polysilicon, any similar substance could be used in place of the nitride layer. For example, an oxide layer or a combination of polysilicon and nitride layers may be used to attenuate the impurity implantation and form the lightly doped polysilicon gate extension 342.

As would be known by one ordinarily skilled in the art given this disclosure, the polysilicon, nitride and oxide layers mentioned above could be formed by a number of common techniques, such as liquid phase chemical vapor deposition (LPCVD) and etched or stripped using common etching techniques such as reactive ion etching (RIE).

Similarly, one ordinarily skilled and the art would understand that the ion implantation could be performed with any appropriate dopant, such as arsenic, provided at any appropriate dose, such as within the range of $1\times10^{13}$–$5\times10^{13}$ atoms/cm$^2$ to $2\times10^{15}$–$6\times10^{15}$ atoms/cm$^2$. After implantation, an activation process such as rapid thermal annealing could be performed to activate the impurity which was implanted.

Figure 5:
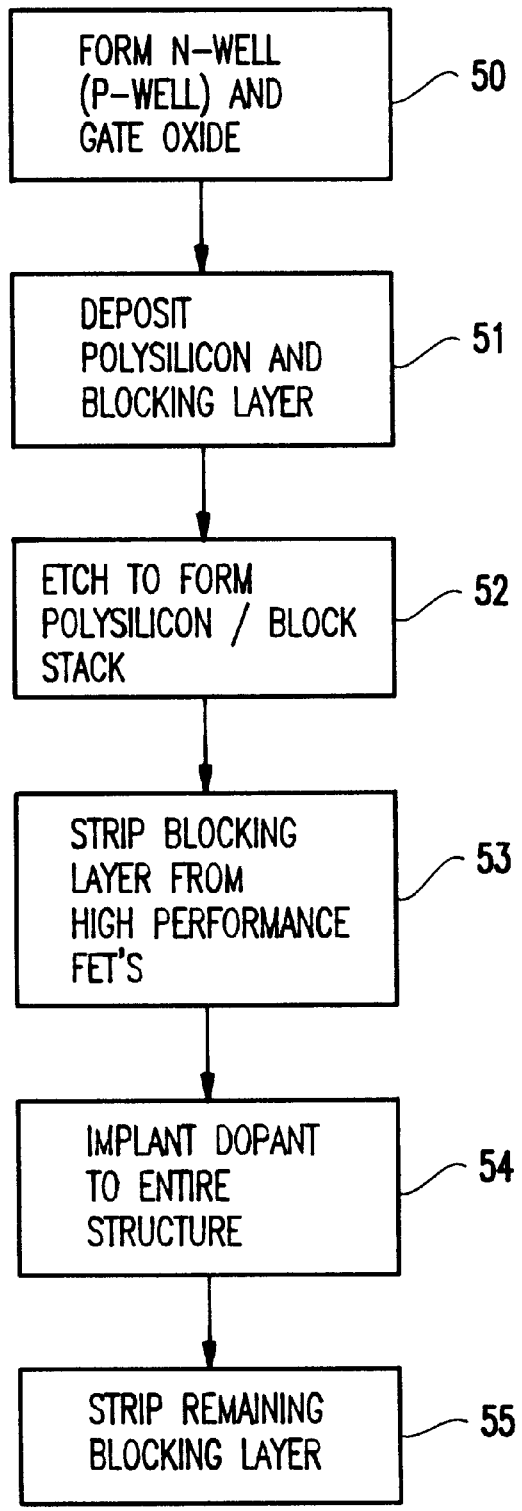
FIG. 5 is a flowchart illustrating a process of the invention.

FIG. 5 is a flowchart illustrating the process of the invention. More specifically, in block 50, the structure, including N-wells 310 and P-wells 402 and a gate oxide layer 311, 403 is formed. In block 51 the polysilicon layer 312, 404 and the nitride blocking layer 313, 405 are formed.

In block 52 the structure is etched to form the polysilicon-nitride gate extensions stacks 330, 420. In block 53 the nitride layer is removed from selected ones of the gate extension stacks which are to become high-performance transistors. In block 54 the impurity is implanted over the entire structure. In block 55 the remaining nitride blocking layer is removed.

The above-mentioned method simultaneously produces, on the same wafer, the structures illustrated in FIGS. 1A–1B which include heavily doped gates 103 n$^{++}$, 109 p$^{++}$ and the structures illustrated and FIGS. 2A–2B which include lightly doped gates 213 p$^+$, 203 n$^+$ for given N-type and P-type transistors A key feature of the invention is that the polysilicon gate is lightly doped at the same time the heavily doped gate, source and drain structures are doped. Therefore, fewer impurity implantation steps are required to produce both heavily doped and lightly doped gates on the same wafer, when compared to conventional processes. Further, the blocker 321, 405 is self-aligned with the polysilicon gate and is formed using the same mask used to form the polysilicon gate. The blocker 321, 405 is used to diffuse the dopant implant to simultaneously form high and low-voltage devices using a single implanting process.

Thus, with the invention, high voltage and low voltage chips can be simultaneously manufactured in a process which does not require the additional mask deposition and removal steps required with the conventional processes.

The benefits of this structure and method allow the formation of poly depleted devices (higher Vmax) and high performance (non-depleted poly) devices on the same chip. The higher allowed Vmax allows the inventive device to be used in additional applications.

As discussed in the Background section, conventionally, selected gate structures are protected with a sacrificial mask during a lighter impurity implantation and additional masks are aligned over the remaining gate structures during a heavier impurity implantation. However, the conventional process suffers from the disadvantage that the doping concentrations within the gate structures will be inconsistent if the masks are improperly aligned.

The invention overcomes this problem because the blocking nitride layer is self-aligned with the gate structure. Therefore, the invention will consistently produce the desired impurity concentrations within the gate structures.

While the invention has been described in terms of preferred embodiments, those skilled in the art will recognize that the invention can be practiced with modification within the spirit and scope of the appended claims.

What is claimed is:

1. A method for forming a semiconductor structure, said semiconductor structure including a substrate having device regions, said method comprising:

forming a plurality of device layers on said substrate, said device layers including a blocking layer;

removing said blocking layer from selected ones of said device regions; and implanting an impurity into said substrate, said device layers and through said blocking layer, wherein, during said forming, a thickness of said blocking layer is selectively varied according to a desired magnitude of implant attenuation, and wherein, during said implanting, only a portion of said impurity passes through said blocking layer.

2. The method in claim 1, wherein said device regions include gate regions, said method further comprising patterning said blocking layer to form blockers over said gate regions.

3. The method in claim 2, wherein:

said removing selectively exposes first gate regions of said gate regions and selectively protects second gate regions of said gate regions; and said implanting simultaneously implants a first dosage of said impurity in said first gate regions and a second dosage lower than said first dosage in said second gate regions.

4. The method in claim 3, wherein first gate regions operate at a lower voltage than said second gate regions.

5. The method in claim 3, wherein said device regions include source regions and drain regions and said implanting simultaneously implants said first dosage in said source regions, said drain regions and said gate regions.

6. The method in claim 1, wherein said implanting comprises a single process.

7. The method in claim 1, wherein said semiconductor structure includes at least one of an N-type field effect transistor and a P-type field effect transistor.

8. The method in claim 1, wherein said blocking layer includes one of a nitride layer and an oxide layer.

9. A method for forming a semiconductor structure, said semiconductor structure including a substrate having device regions, said method comprising:

forming a plurality of device layers on said substrate, said device layers including a blocking layer having a thickness correlating to a magnitude of implant attenuation;

removing said blocking layer from selected ones of said device regions; and implanting an impurity into said substrate, said device layers and through said blocking layer, wherein, during said implainting only a portion of said impurity passes through said blocking layer, and wherein said device regions include gate regions, said method further comprising patterning said blocking layer to form blockers over said gate regions, and wherein said device layers include a gate layer and said patterning includes removing portions of said gate layer not covered by said blockers to form said gate regions below said blockers.

10. A method for forming a semiconductor structure, said semiconductor structure including a substrate having device regions, said method comprising:

forming a plurality of device layers on said substrate, said device layers including a blocking layer having a thickness correlating to a magnitude of implant attenuation;

removing said blocking layer from selected ones of said device regions; and implanting an impurity into said substrate, said device layers and through said blocking layer, wherein, during said implanting only a portion of said impurity passes through said blocking layer, wherein said device regions include gate regions, said method further comprising patterning said blocking layer to form blockers over said gate regions, and wherein said blocking layer and said gate layer are patterned in a single removal process.

11. A method of simultaneously forming first transistors having a first operating voltage and second transistors having a second operating voltage higher than said first operating voltage on a semiconductor wafer, said method comprising:

forming a plurality of device layers on a substrate, said device layers including a blocking layer having a thickness correlating to a magnitude of implant attenuation;

removing a portion of said blocking layer; and implanting an impurity into said substrate, said device layers and through said blocking layer, wherein, during said implanting only a portion of said impurity passes through said blocking layer.

12. The method in claim 11, wherein one of said device layers includes gate regions, said removing comprising patterning said blocking layer to form blockers over said gate regions.

13. A method of simultaneously forming first transistors having a first operating voltage and second transistors having a second operating voltage higher than said first operating voltage on a semiconductor wafer, said method comprising:

forming a plurality of device layers on a substrate, said device layers including a blocking layer having a thickness correlating to a magnitude of implant attenuation;

removing a portion of said blocking layer; and implanting an impurity into said substrate, said device layers and through said blocking layer, wherein, during said implanting only a portion of said impurity passes through said blocking layer, wherein one of said device layers includes gate regions, said removing comprising patterning said blocking layer to form blockers over said gate regions, and wherein said device layers include a gate layer and said patterning includes removing portions of said gate layer not covered by said blockers to form said gate regions below said blockers.

14. The method in claim 12, further comprising selectively removing said blockers to expose first gate regions of said gate regions and protect second gate regions of said gate regions, wherein said implanting simultaneously implants a first dosage of said impurity in said first gate regions and a second dosage lower than said first dosage in said second gate regions.

15. The method in claim 14, wherein first gate regions operate at said first operating voltage and said second gate regions operate at said second operating voltage.

16. The method in claim 14, wherein said device regions include source regions and drain regions and said implanting simultaneously implants said first dosage in said source regions, said drain regions and said gate regions.

17. The method in claim 13, wherein said blocking layer and said gate layer are patterned in a single removal process.

18. The method in claim 11, wherein said implanting comprises a single process.

19. The method in claim 11, wherein said semiconductor wafer includes at least one of an N-type field effect transistor and a P-type field effect transistor.

20. The method in claim 11, wherein said blocking layer includes one of a nitride layer and an oxide layer.

21. A method for selectively doping semiconductor transistors, said semiconductor transistors including gate regions, source regions adjacent respective ones of said gate regions and drain regions adjacent respective ones of said gate regions and opposite respective ones of said source regions, said method comprising steps of:

forming a blocking layer having a thickness correlating to a magnitude of implant attenuation over said gate regions;

removing said blocking layer from selected ones of said gate regions to form exposed gate regions and blocked gate regions; and simultaneously implanting an impurity through said blocking layer to said blocked gate regions and directly into said exposed gate regions, said source regions and said drain regions, such that said exposed gate regions have a higher impurity concentration than that of said blocked gate regions.

22. The method in claim 21, wherein said implanting implants said higher impurity concentration dosage in said source and drain regions.

23. The method in claim 21, wherein exposed gate regions operate at a lower voltage than said blocked gate regions.

24. The method in claim 21, wherein said implanting comprises a single process.

25. The method in claim 21, wherein said semiconductor transistors include at least one of an N-type field effect transistor and a P-type field effect transistor.

26. The method in claim 21, wherein said blocking layer includes one of a nitride layer and an oxide layer.

* * * * *